United States Patent [19]

Takahashi

[11] 4,124,817
[45] Nov. 7, 1978

[54] BANDWIDTH SWITCHING CIRCUIT FOR INTERMEDIATE FREQUENCY AMPLIFIER STAGE IN FM RECEIVER

[75] Inventor: Tetsuo Takahashi, Tokyo, Japan

[73] Assignee: Torio Kabushiki Kaisha, Tokyo, Japan

[21] Appl. No.: 680,226

[22] Filed: Apr. 26, 1976

[30] Foreign Application Priority Data

Apr. 28, 1975 [JP] Japan ............................ 50-51651

[51] Int. Cl.² ............................................. H04B 1/06
[52] U.S. Cl. ................................. 325/344; 325/377;
  325/387; 325/427; 325/479
[58] Field of Search ................ 325/313, 344, 347-349,
  325/376, 377, 387, 472, 473, 479, 488-490, 427,
  474; 329/131-135; 330/126, 132

[56] References Cited

U.S. PATENT DOCUMENTS

| | | | |
|---|---|---|---|
| 2,609,493 | 9/1952 | Wilmotte | 325/344 |
| 2,927,997 | 3/1960 | Day | 325/344 |
| 2,969,459 | 1/1961 | Hern | 325/344 |
| 3,982,186 | 9/1976 | Furuno | 325/344 |

Primary Examiner—Robert L. Griffin
Assistant Examiner—Jin F. Ng
Attorney, Agent, or Firm—Lane, Aitken, Dunner & Ziems

[57] ABSTRACT

This invention provides a bandwidth switching circuit for an intermediate frequency amplifier stage in an FM receiver that insures clear reception of desired signals by automatically switching the intermediate frequency amplifier stage between the wide and narrow bandwidths according to the radio field conditions. The bandwidth switching circuit includes a detector for detecting beat components due to interference contained in received signals and a change-over switch for switching the bandwidth switching circuit according to signals detected by the detector, whereby the bandwidth of the intermediate frequency amplifier stage is automatically switched depending on whether the beat components are present or not.

7 Claims, 4 Drawing Figures

BANDWIDTH SWITCHING CIRCUIT FOR INTERMEDIATE FREQUENCY AMPLIFIER STAGE IN FM RECEIVER

BACKGROUND OF THE INVENTION

This invention relates to an improved bandwidth switching circuit for an intermediate frequency amplifier stage in an FM receiver.

The bandwidth of an intermediate frequency amplifier stage in an FM receiver is determined with consideration for selectivity, distortion and other characteristics. Narrowing the bandwitdth improves selectivity and thus substantially attenuates interference from a nearby station, but increases distortion of demodulation signals. In contrast, the wider bandwidth attentuates demodulation signal distortion and improves tone quality, but renders the receiver more susceptible to interference. In order to make effective use of these conflicting characteristics of the narrow and wide bandwidths, a bandwidth switching circuit for an intermediate frequency amplifier stage as shown in FIG. 1 has heretofore been proposed. More specifically, there are provided a narrow-band intermediate frequency amplifier 9 and a wide-band intermediate frequency amplifier 10, either of which can be selected by a change-over switch 11, as an intermediate frequency amplifier stage 5 in an FM receiver comprising an antenna 1, radio frequency amplifier stage 2, local oscillator 3, mixer 4, intermediate frequency amplifier stage 5, FM detector 6, audio frequency amplifier stage 7, and speaker 8. Under a good, interference-free radio field condition, the wide-band intermediate frequency amplifier 10 is selectively connected by the change-over switch 11, whereby distortion of demodulation signal is reduced and good tone quality is obtained. Under a bad radio interference condition, the narrow-band intermediate frequency amplifier 9 is connected by the change-over switch 11 to permit clear reception of desired signals, eliminating the interference.

The change-over switch 11 in the conventional receivers, however, has been manually operated according to the radio field conditions.

SUMMARY OF THE INVENTION

The object of this invention is to provide a bandwidth switching circuit for an intermediate frequency amplifier stage in an FM receiver that always insures clear reception of desired signals by automatically switching the intermediate frequency amplifier stage between the wide and narrow bandwidths according to the radio field conditions. The bandwidth switching circuit includes a detector for detecting beat components due to interference contained in received signals and a change-over switch for switching the bandwidth switching circuit according to signals detected by the detector, whereby the bandwidth of the intermediate frequency amplifier stage is automatically switched depending on whether the beat components are present or not. Interference is detected as amplitude modulation above a certain frequency range determined by the nominal minimum FM station separation.

DESCRIPTION OF THE PREFERRED EMBODIMENT

Figure 1:
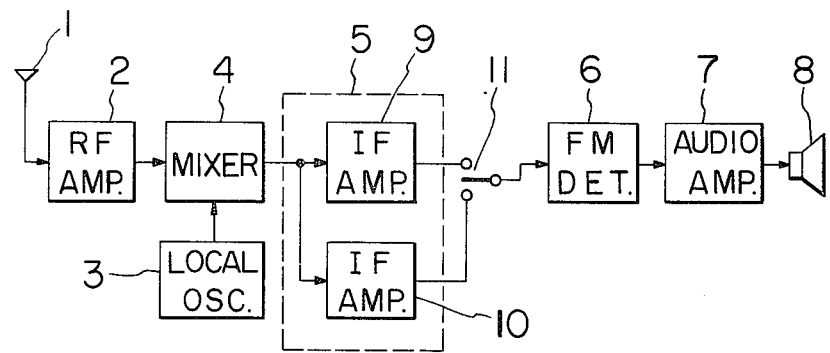
FIG. 1 is a block diagram of a conventional FM receiver.
Figure 2:
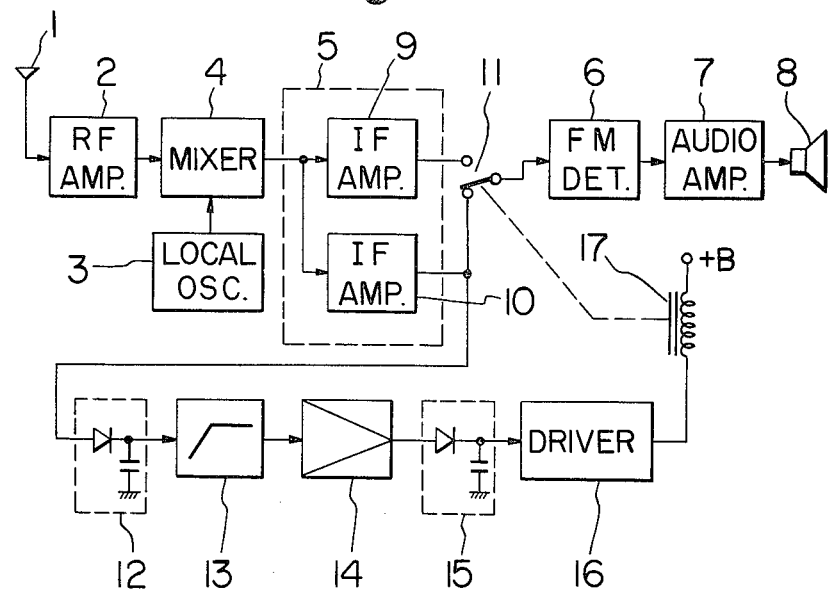
FIG. 2 is a block diagram showing an embodiment of the present invention.

FIG. 2 is a block diagram showing an embodiment of this invention in which component elements similar to those in FIG. 1 are denoted by similar reference numerals.

Amplitude modulation (hereinafter abbreviated as AM) components contained in intermediate frequency output from a wide-band intermediate frequency amplifier 10 are detected by an AM detector 12. The AM components thus detected contain AM components due to nonlinearity of the pre-amplifier stage, AM components due to multipath interference, and beat components resulting from the interference between the desired station and nearby stations. Since FM broadcasting stations are at present provided at nominal intervals of 100KHz in Japan (200KHz in U.S.A.), the beat components produced by the interference between the desired station and the nearest station have a frequency of about 100 KHz, which is higher than those of the above-mentioned other AM components. These beat components alone are taken out through a high-pass filter 13, amplified in an amplifier 14, rectified in a rectifier 15, and then supplied to a driver circuit 16. The driver circuit 16 is for energizing a relay 17 that actuates a change-over switch 11.

The change-over switch 11 is normally connected to a wide-band intermediate frequency amplifier 10, and switched to a narrow-band intermediate frequency amplifier 9 by the relay 17 only when beat components due to interference are detected, so as to permit interference-free reception.

The time constant of a system from the AM detector 12 to the driver circuit 16 must be large enough to exclude the influence of such impulse noises as those caused by automobile ignition and the like.

Figure 3:
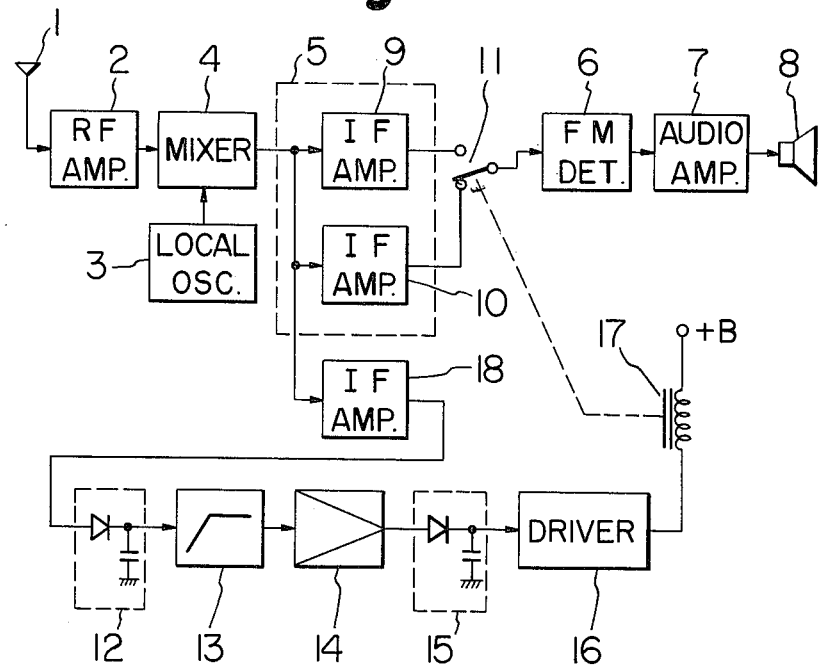
FIGS. 3 and 4 are block diagrams illustrating other embodiments of the present invention.
Figure 4:
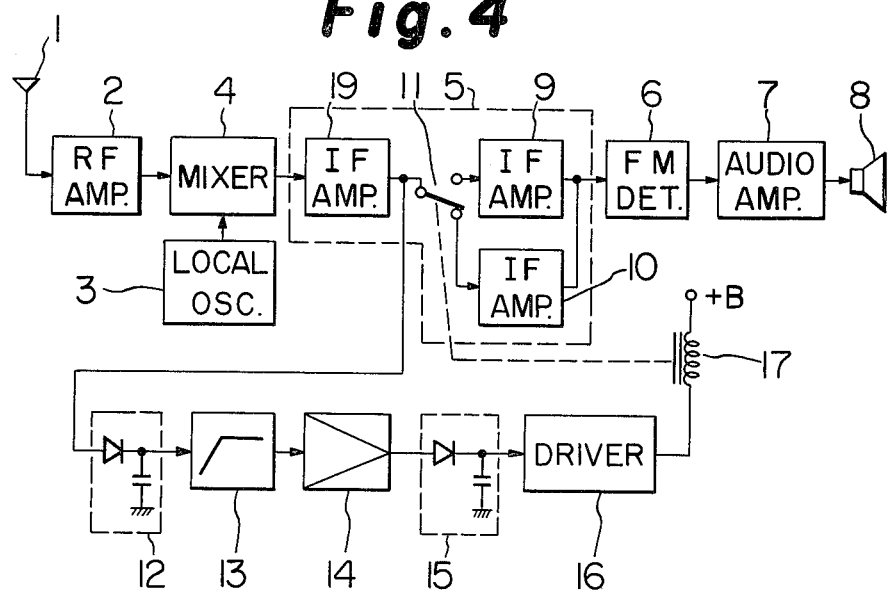

FIGS. 3 and 4 illustrate other embodiments of this invention. In the embodiment of FIG. 3, a wide-band intermediate frequency amplifier 18 whose function is limited to the detection of beat components due to interference is added. In the embodiment of FIG. 4, the change-over switch 11 is positioned at the inputs to the amplifiers 9 and 10 which are connected directed to the FM detectors. When the change-over switch 11 of this embodiment is connected to the narrow-band intermediate frequency amplifier 9, it is impossible to detect beat components due to interference out of output from the wide-band intermediate frequency amplifier 10. This problem is solved by adding a wide-band intermediate frequency amplifier 19.

As evident from the above description, the intermediate frequency amplifier stage in this invention, comprising a wide-band and narrow-band intermediate frequency amplifier, can automatically change its bandwidth by selecting either of said amplifiers depending on whether beat components due to interference are present or not. This automatic bandwidth selection improves selectivity to exclude interference, attenuates distortion, and thereby insures satisfactory signal reception.

What is claimed is:

1. In a bandwidth switching circuit of an FM receiver to switch the bandwidth of an intermediate frequency amplifier stage from a wide bandwidth to a narrow bandwidth and vice versa, the improvement comprising first means for detecting in the signals received by said receiver beat components due to interference between stations adjacent in carrier frequency, said beat components being included in the amplitude modulation components contained in the intermediate frequency signal, and second means for switching said bandwidth switching circuit according to signals detected by said first detecting means, whereby the bandwidth of said intermediate frequency amplifier stage is automatically switched depending on whether the beat components are present or not.

2. The circuit of claim 1, wherein said first means includes detector means for receiving the output of a wide-band intermediate frequency amplifier and detecting in said output amplitude modulation above a certain frequency range determined by the nominal minimum FM station separation.

3. The circuit of claim 2, wherein said detector means includes an AM detector connected to receive an intermediate frequency signal, a high-pass filter connected to receive the output of said AM detector and a rectifier circuit connected to receive the output of said filter, said rectifier circuit including means for producing a signal to said second means.

4. The circuit of claim 3, wherein said second means includes relay circuit means responsive to said signal for actuating said bandwidth switching circuit.

5. An FM receiver circuit, comprising means for receiving a radio frequency signal and providing an intermediate frequency signal, a wide-band intermediate frequency amplifier, connected to receive said intermediate frequency signal, a narrow-band intermediate frequency amplifier connected to receive said intermediate frequency signal, an FM detector circuit, switch means for alternately connecting the output of either said wide-band or narrow-band intermediate frequency amplifier to said FM detector circuit, said switch means normally connecting said wide-band intermediate frequency amplifier output to said FM detector circuit, interference detection circuit means connected to receive said wide-band intermediate frequency amplifier output for providing a control signal indicative of the detection of amplitude modulation above a certain frequency range determined by the nominal minimum FM station separation, and relay means responsive to said control signal for actuating said switch means to connect said narrow-band intermediate frequency amplifier output to said FM detector circuit.

6. An FM receiver circuit, comprising means for receiving a radio frequency signal and providing an intermediate frequency signal, first and second wide-band intermediate frequency amplifiers connected to receive said intermediate frequency signal, a narrow-band intermediate frequency amplifier connected to receive said intermediate frequency signal, an FM detector circuit, switch means for alternately connecting the output of either said first wide-band or said narrow-band intermediate frequency amplifier to said FM detector circuit, said switch means normally connecting said first wide-band intermediate frequency amplifier to said FM detector circuit, interference detection circuit means connected to receive the output of said second wide-band intermediate frequency amplifier for providing a control signal indicative of the detection of amplitude modulation above a certain frequency range determined by the nominal minimum FM station separation, and relay means responsive to said control signal for actuating said switch means to connect said narrow-band intermediate frequency amplifier output to said FM detector circuit.

7. An FM receiver circuit, comprising means for receiving a radio frequency signal and providing an intermediate frequency signal, a first wide-band intermediate frequency amplifier connected to receive said intermediate frequency signal, a second wide-band intermediate frequency amplifier and a narrow-band intermediate frequency amplifier, switch means for alternately connecting the input of either said second wide-band or said narrow-band intermediate amplifier to the output of said first wide-band intermediate frequency amplifier, said switch means normally interconnecting said first and second intermediate frequency amplifiers, an FM detector circuit operatively connected to receive the outputs of said second wide-band and said narrow-band intermediate frequency amplifiers, interference detection circuit means connected to receive the output of said first wide-band intermediate frequency amplifier for providing a control signal indicative of amplitude modulation above a certain frequency range determined by the nominal minimum FM station separation, and relay means responsive to said control signal for actuating said switch means to connect said narrow-band intermediate frequency amplifier to said first wide-band intermediate frequency amplifier.

* * * * *

UNITED STATES PATENT AND TRADEMARK OFFICE
CERTIFICATE OF CORRECTION

PATENT NO. : 4,124,817
DATED : November 7, 1978
INVENTOR(S) : Tetsuo Takahashi

It is certified that error appears in the above–identified patent and that said Letters Patent are hereby corrected as shown below:

The assignee information appearing on the face of the patent, block [73] is incorrect. "Torio" should read --Trio--.

Signed and Sealed this

Tenth Day of July 1979

[SEAL]

Attest:

Attesting Officer

LUTRELLE F. PARKER
Acting Commissioner of Patents and Trademarks